United States Patent
Chaji (10) Patent No.: US 10,439,159 B2
(45) Date of Patent: *Oct. 8, 2019

(54) ELECTRODE CONTACTS

(71) Applicant: Ignis Innovation Inc., Waterloo (CA)

(72) Inventor: Gholamreza Chaji, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/973,696

(22) Filed: May 8, 2018

(65) Prior Publication Data

US 2018/0261795 A1    Sep. 13, 2018

Related U.S. Application Data

(63) Continuation of application No. 15/793,032, filed on Oct. 25, 2017, now abandoned, which is a
(Continued)

(51) Int. Cl.
*H01L 51/52* (2006.01)
*H01L 51/00* (2006.01)
*H01L 27/32* (2006.01)

(52) U.S. Cl.
CPC ...... *H01L 51/5212* (2013.01); *H01L 27/3248* (2013.01); *H01L 51/0021* (2013.01);
(Continued)

(58) Field of Classification Search
CPC ............. H01L 51/5212; H01L 51/0021; H01L 51/5209; H01L 51/5215; H01L 51/5225;
(Continued)

(56) References Cited

U.S. PATENT DOCUMENTS 3,506,851 A    4/1970    Polkinghorn
3,774,055 A    11/1973   Bapat
(Continued)

FOREIGN PATENT DOCUMENTS

CA    1 294 034    1/1992
CA    2 109 951    11/1992
(Continued)

OTHER PUBLICATIONS

Ahnood : "Effect of threshold voltage instability on field effect mobility in thin film transistors deduced from constant current measurements"; dated Aug. 2009.
(Continued)

*Primary Examiner* — Sitaramarao S Yechuri
(74) *Attorney, Agent, or Firm* — Stratford Managers Corporaton (57) ABSTRACT

A device structure providing contact to conductive layers via a deep trench structure is disclosed. The device includes a first dielectric layer including a first opening. A first conductive layer is deposited over the first dielectric layer and the first opening. A second dielectric layer is deposited on the first conductive layer. The second dielectric layer includes a second opening. A second conductive layer is deposited over the second dielectric layer and the first and second openings. A semiconductor layer is deposited on the second dielectric layer such that the semiconductor layer is not continuous on at least part of the walls of the first or second openings. A top electrode layer is deposited on the semiconductor layer. The top electrode layer is in contact with the second conductive layer on at least part of the walls of the first or second openings.

16 Claims, 5 Drawing Sheets

Related U.S. Application Data continuation of application No. 15/296,424, filed on Oct. 18, 2016, now Pat. No. 9,831,462, which is a continuation of application No. 14/581,193, filed on Dec. 23, 2014, now Pat. No. 9,502,653.

(60) Provisional application No. 61/929,699, filed on Jan. 21, 2014, provisional application No. 61/920,732, filed on Dec. 25, 2013.

(52) U.S. Cl.
CPC ...... *H01L 51/5209* (2013.01); *H01L 51/5215* (2013.01); *H01L 51/5225* (2013.01); *H01L 51/5228* (2013.01); *H01L 51/5234* (2013.01); *H01L 2251/5315* (2013.01)

(58) Field of Classification Search
CPC ............. H01L 51/5228; H01L 51/5234; H01L 27/3248; H01L 2251/5315
See application file for complete search history.

(56) References Cited

U.S. PATENT DOCUMENTS

| | | | |
|---|---|---|---|
| 4,090,096 A | 5/1978 | Nagami |
| 4,160,934 A | 7/1979 | Kirsch |
| 4,295,091 A | 10/1981 | Ponkala |
| 4,354,162 A | 10/1982 | Wright |
| 4,943,956 A | 7/1990 | Noro |
| 4,996,523 A | 2/1991 | Bell |
| 5,153,420 A | 10/1992 | Hack |
| 5,198,803 A | 3/1993 | Shie |
| 5,204,661 A | 4/1993 | Hack |
| 5,266,515 A | 11/1993 | Robb |
| 5,489,918 A | 2/1996 | Mosier |
| 5,498,880 A | 3/1996 | Lee |
| 5,557,342 A | 9/1996 | Eto |
| 5,561,381 A | 10/1996 | Jenkins |
| 5,572,444 A | 11/1996 | Lentz |
| 5,589,847 A | 12/1996 | Lewis |
| 5,619,033 A | 4/1997 | Weisfield |
| 5,648,276 A | 7/1997 | Hara |
| 5,670,973 A | 9/1997 | Bassetti |
| 5,684,365 A | 11/1997 | Tang |
| 5,691,783 A | 11/1997 | Numao |
| 5,714,968 A | 2/1998 | Ikeda |
| 5,723,950 A | 3/1998 | Wei |
| 5,744,824 A | 4/1998 | Kousai |
| 5,745,660 A | 4/1998 | Kolpatzik |
| 5,748,160 A | 5/1998 | Shieh |
| 5,815,303 A | 9/1998 | Berlin |
| 5,870,071 A | 2/1999 | Kawahata |
| 5,874,803 A | 2/1999 | Garbuzov |
| 5,880,582 A | 3/1999 | Sawada |
| 5,903,248 A | 5/1999 | Irwin |
| 5,917,280 A | 6/1999 | Burrows |
| 5,923,794 A | 7/1999 | McGrath |
| 5,945,972 A | 8/1999 | Okumura |
| 5,949,398 A | 9/1999 | Kim |
| 5,952,789 A | 9/1999 | Stewart |
| 5,952,991 A | 9/1999 | Akiyama |
| 5,982,104 A | 11/1999 | Sasaki |
| 5,990,629 A | 11/1999 | Yamada |
| 6,023,259 A | 2/2000 | Howard |
| 6,069,365 A | 5/2000 | Chow |
| 6,091,203 A | 7/2000 | Kawashima |
| 6,097,360 A | 8/2000 | Holloman |
| 6,144,222 A | 11/2000 | Ho |
| 6,177,915 B1 | 1/2001 | Beeteson |
| 6,197,181 B1 * | 3/2001 | Chen ............... H01L 21/2885 204/198 |
| 6,229,506 B1 | 5/2001 | Dawson |
| 6,229,508 B1 | 5/2001 | Kane |
| 6,246,180 B1 | 6/2001 | Nishigaki |
| 6,252,248 B1 | 6/2001 | Sano |
| 6,259,424 B1 | 7/2001 | Kurogane |
| 6,262,589 B1 | 7/2001 | Tamukai |
| 6,271,825 B1 | 8/2001 | Greene |
| 6,288,696 B1 | 9/2001 | Holloman |
| 6,304,039 B1 | 10/2001 | Appelberg |
| 6,307,322 B1 | 10/2001 | Dawson |
| 6,310,962 B1 | 10/2001 | Chung |
| 6,320,325 B1 | 11/2001 | Cok |
| 6,323,631 B1 | 11/2001 | Juang |
| 6,329,971 B2 | 12/2001 | McKnight |
| 6,356,029 B1 | 3/2002 | Hunter |
| 6,373,454 B1 | 4/2002 | Knapp |
| 6,377,237 B1 | 4/2002 | Sojourner |
| 6,392,617 B1 | 5/2002 | Gleason |
| 6,404,139 B1 | 6/2002 | Sasaki |
| 6,414,661 B1 | 7/2002 | Shen |
| 6,417,825 B1 | 7/2002 | Stewart |
| 6,433,488 B1 | 8/2002 | Bu |
| 6,437,106 B1 | 8/2002 | Stoner |
| 6,445,369 B1 | 9/2002 | Yang |
| 6,475,845 B2 | 11/2002 | Kimura |
| 6,501,098 B2 | 12/2002 | Yamazaki |
| 6,501,466 B1 | 12/2002 | Yamagishi |
| 6,518,962 B2 | 2/2003 | Kimura |
| 6,522,315 B2 | 2/2003 | Ozawa |
| 6,525,683 B1 | 2/2003 | Gu |
| 6,531,827 B2 | 3/2003 | Kawashima |
| 6,541,921 B1 | 4/2003 | Luciano, Jr. |
| 6,542,138 B1 | 4/2003 | Shannon |
| 6,555,420 B1 | 4/2003 | Yamazaki |
| 6,577,302 B2 | 6/2003 | Hunter |
| 6,580,408 B1 | 6/2003 | Bae |
| 6,580,657 B2 | 6/2003 | Sanford |
| 6,583,398 B2 | 6/2003 | Harkin |
| 6,583,775 B1 | 6/2003 | Sekiya |
| 6,594,606 B2 | 7/2003 | Everitt |
| 6,618,030 B2 | 9/2003 | Kane |
| 6,639,244 B1 | 10/2003 | Yamazaki |
| 6,668,645 B1 | 12/2003 | Gilmour |
| 6,677,713 B1 | 1/2004 | Sung |
| 6,680,580 B1 | 1/2004 | Sung |
| 6,687,266 B1 | 2/2004 | Ma |
| 6,690,000 B1 | 2/2004 | Muramatsu |
| 6,690,344 B1 | 2/2004 | Takeuchi |
| 6,693,388 B2 | 2/2004 | Oomura |
| 6,693,610 B2 | 2/2004 | Shannon |
| 6,697,057 B2 | 2/2004 | Koyama |
| 6,720,942 B2 | 4/2004 | Lee |
| 6,724,151 B2 | 4/2004 | Yoo |
| 6,734,636 B2 | 5/2004 | Sanford |
| 6,738,034 B2 | 5/2004 | Kaneko |
| 6,738,035 B1 | 5/2004 | Fan |
| 6,753,655 B2 | 6/2004 | Shih |
| 6,753,834 B2 | 6/2004 | Mikami |
| 6,756,741 B2 | 6/2004 | Li |
| 6,756,952 B1 | 6/2004 | Decaux |
| 6,756,958 B2 | 6/2004 | Furuhashi |
| 6,765,549 B1 | 7/2004 | Yamazaki |
| 6,771,028 B1 | 8/2004 | Winters |
| 6,777,712 B2 | 8/2004 | Sanford |
| 6,777,888 B2 | 8/2004 | Kondo |
| 6,781,306 B2 | 8/2004 | Park |
| 6,781,567 B2 | 8/2004 | Kimura |
| 6,806,497 B2 | 10/2004 | Jo |
| 6,806,638 B2 | 10/2004 | Lih |
| 6,806,857 B2 | 10/2004 | Sempel |
| 6,809,706 B2 | 10/2004 | Shimoda |
| 6,815,975 B2 | 11/2004 | Nara |
| 6,828,950 B2 | 12/2004 | Koyama |
| 6,853,371 B2 | 2/2005 | Miyajima |
| 6,859,193 B1 | 2/2005 | Yumoto |
| 6,873,117 B2 | 3/2005 | Ishizuka |
| 6,876,346 B2 | 4/2005 | Anzai |
| 6,885,356 B2 | 4/2005 | Hashimoto |
| 6,900,485 B2 | 5/2005 | Lee |
| 6,903,734 B2 | 6/2005 | Eu |
| 6,909,243 B2 | 6/2005 | Inukai |
| 6,909,419 B2 | 6/2005 | Zavracky |

(56) References Cited

U.S. PATENT DOCUMENTS

| | | |
|---|---|---|
| 6,911,960 B1 | 6/2005 | Yokoyama |
| 6,911,964 B2 | 6/2005 | Lee |
| 6,914,448 B2 | 7/2005 | Jinno |
| 6,919,871 B2 | 7/2005 | Kwon |
| 6,924,602 B2 | 8/2005 | Komiya |
| 6,937,215 B2 | 8/2005 | Lo |
| 6,937,220 B2 | 8/2005 | Kitaura |
| 6,940,214 B1 | 9/2005 | Komiya |
| 6,943,500 B2 | 9/2005 | LeChevalier |
| 6,947,022 B2 | 9/2005 | McCartney |
| 6,954,194 B2 | 10/2005 | Matsumoto |
| 6,956,547 B2 | 10/2005 | Bae |
| 6,975,142 B2 | 12/2005 | Azami |
| 6,975,332 B2 | 12/2005 | Arnold |
| 6,995,510 B2 | 2/2006 | Murakami |
| 6,995,519 B2 | 2/2006 | Arnold |
| 7,023,408 B2 | 4/2006 | Chen |
| 7,027,015 B2 | 4/2006 | Booth, Jr. |
| 7,027,078 B2 | 4/2006 | Reihl |
| 7,034,793 B2 | 4/2006 | Sekiya |
| 7,038,392 B2 | 5/2006 | Libsch |
| 7,053,875 B2 | 5/2006 | Chou |
| 7,057,359 B2 | 6/2006 | Hung |
| 7,061,451 B2 | 6/2006 | Kimura |
| 7,064,733 B2 | 6/2006 | Cok |
| 7,071,932 B2 | 7/2006 | Libsch |
| 7,088,051 B1 | 8/2006 | Cok |
| 7,088,052 B2 | 8/2006 | Kimura |
| 7,102,378 B2 | 9/2006 | Kuo |
| 7,106,285 B2 | 9/2006 | Naugler |
| 7,112,820 B2 | 9/2006 | Chang |
| 7,116,058 B2 | 10/2006 | Lo |
| 7,119,493 B2 | 10/2006 | Fryer |
| 7,122,835 B1 | 10/2006 | Ikeda |
| 7,127,380 B1 | 10/2006 | Iverson |
| 7,129,914 B2 | 10/2006 | Knapp |
| 7,161,566 B2 | 1/2007 | Cok |
| 7,164,417 B2 | 1/2007 | Cok |
| 7,193,589 B2 | 3/2007 | Yoshida |
| 7,224,332 B2 | 5/2007 | Cok |
| 7,227,519 B1 | 6/2007 | Kawase |
| 7,245,277 B2 | 7/2007 | Ishizuka |
| 7,246,912 B2 | 7/2007 | Burger |
| 7,248,236 B2 | 7/2007 | Nathan |
| 7,262,753 B2 | 8/2007 | Tanghe |
| 7,274,363 B2 | 9/2007 | Ishizuka |
| 7,310,092 B2 | 12/2007 | Imamura |
| 7,315,295 B2 | 1/2008 | Kimura |
| 7,321,348 B2 | 1/2008 | Cok |
| 7,339,560 B2 | 3/2008 | Sun |
| 7,355,574 B1 | 4/2008 | Leon |
| 7,358,941 B2 | 4/2008 | Ono |
| 7,368,868 B2 | 5/2008 | Sakamoto |
| 7,397,485 B2 | 7/2008 | Miller |
| 7,411,571 B2 | 8/2008 | Huh |
| 7,414,600 B2 | 8/2008 | Nathan |
| 7,423,617 B2 | 9/2008 | Giraldo |
| 7,453,054 B2 | 11/2008 | Lee |
| 7,474,285 B2 | 1/2009 | Kimura |
| 7,502,000 B2 | 3/2009 | Yuki |
| 7,528,812 B2 | 5/2009 | Tsuge |
| 7,535,449 B2 | 5/2009 | Miyazawa |
| 7,554,512 B2 | 6/2009 | Steer |
| 7,569,849 B2 | 8/2009 | Nathan |
| 7,576,718 B2 | 8/2009 | Miyazawa |
| 7,580,012 B2 | 8/2009 | Kim |
| 7,589,707 B2 | 9/2009 | Chou |
| 7,605,792 B2 | 10/2009 | Son |
| 7,609,239 B2 | 10/2009 | Chang |
| 7,619,594 B2 | 11/2009 | Hu |
| 7,619,597 B2 | 11/2009 | Nathan |
| 7,633,470 B2 | 12/2009 | Kane |
| 7,656,370 B2 | 2/2010 | Schneider |
| 7,675,485 B2 | 3/2010 | Steer |
| 7,800,558 B2 | 9/2010 | Routley |
| 7,847,764 B2 | 12/2010 | Cok |
| 7,859,492 B2 | 12/2010 | Kohno |
| 7,868,859 B2 | 1/2011 | Tomida |
| 7,876,294 B2 | 1/2011 | Sasaki |
| 7,924,249 B2 | 4/2011 | Nathan |
| 7,932,883 B2 | 4/2011 | Klompenhouwer |
| 7,969,390 B2 | 6/2011 | Yoshida |
| 7,978,187 B2 | 7/2011 | Nathan |
| 7,994,712 B2 | 8/2011 | Sung |
| 8,026,876 B2 | 9/2011 | Nathan |
| 8,031,180 B2 | 10/2011 | Miyamoto |
| 8,049,420 B2 | 11/2011 | Tamura |
| 8,077,123 B2 | 12/2011 | Naugler, Jr. |
| 8,115,707 B2 | 2/2012 | Nathan |
| 8,208,084 B2 | 6/2012 | Lin |
| 8,223,177 B2 | 7/2012 | Nathan |
| 8,232,939 B2 | 7/2012 | Nathan |
| 8,259,044 B2 | 9/2012 | Nathan |
| 8,264,431 B2 | 9/2012 | Bulovic |
| 8,279,143 B2 | 10/2012 | Nathan |
| 8,294,696 B2 | 10/2012 | Min |
| 8,314,783 B2 | 11/2012 | Sambandan |
| 8,339,386 B2 | 12/2012 | Leon |
| 8,441,206 B2 | 5/2013 | Myers |
| 8,493,296 B2 | 7/2013 | Ogawa |
| 8,581,809 B2 | 11/2013 | Nathan |
| 8,654,114 B2 | 2/2014 | Shimizu |
| 9,125,278 B2 | 9/2015 | Nathan |
| 9,368,063 B2 | 6/2016 | Chaji |
| 9,418,587 B2 | 8/2016 | Chaji |
| 9,430,958 B2 | 8/2016 | Chaji |
| 9,472,139 B2 | 10/2016 | Nathan |
| 9,489,891 B2 | 11/2016 | Nathan |
| 9,489,897 B2 | 11/2016 | Jaffari |
| 9,502,653 B2 * | 11/2016 | Chaji ................. H01L 27/3248 |
| 9,530,349 B2 | 12/2016 | Chaji |
| 9,530,352 B2 | 12/2016 | Nathan |
| 9,536,460 B2 | 1/2017 | Chaji |
| 9,536,465 B2 | 1/2017 | Chaji |
| 9,589,490 B2 | 3/2017 | Chaji |
| 9,633,597 B2 | 4/2017 | Nathan |
| 9,640,112 B2 | 5/2017 | Jaffari |
| 9,721,512 B2 | 8/2017 | Soni |
| 9,741,279 B2 | 8/2017 | Chaji |
| 9,741,282 B2 | 8/2017 | Giannikouris |
| 9,761,170 B2 | 9/2017 | Chaji |
| 9,773,439 B2 | 9/2017 | Chaji |
| 9,773,441 B2 | 9/2017 | Chaji |
| 9,786,209 B2 | 10/2017 | Chaji |
| 2001/0002703 A1 | 6/2001 | Koyama |
| 2001/0009283 A1 | 7/2001 | Arao |
| 2001/0024181 A1 | 9/2001 | Kubota |
| 2001/0024186 A1 | 9/2001 | Kane |
| 2001/0026257 A1 | 10/2001 | Kimura |
| 2001/0030323 A1 | 10/2001 | Ikeda |
| 2001/0035863 A1 | 11/2001 | Kimura |
| 2001/0038367 A1 | 11/2001 | Inukai |
| 2001/0040541 A1 | 11/2001 | Yoneda |
| 2001/0043173 A1 | 11/2001 | Troutman |
| 2001/0045929 A1 | 11/2001 | Prache |
| 2001/0052606 A1 | 12/2001 | Sempel |
| 2001/0052940 A1 | 12/2001 | Hagihara |
| 2002/0000576 A1 | 1/2002 | Inukai |
| 2002/0011796 A1 | 1/2002 | Koyama |
| 2002/0011799 A1 | 1/2002 | Kimura |
| 2002/0012057 A1 | 1/2002 | Kimura |
| 2002/0014851 A1 | 2/2002 | Tai |
| 2002/0018034 A1 | 2/2002 | Ohki |
| 2002/0030190 A1 | 3/2002 | Ohtani |
| 2002/0047565 A1 | 4/2002 | Nara |
| 2002/0052086 A1 | 5/2002 | Maeda |
| 2002/0067134 A1 | 6/2002 | Kawashima |
| 2002/0084463 A1 | 7/2002 | Sanford |
| 2002/0101152 A1 | 8/2002 | Kimura |
| 2002/0101172 A1 | 8/2002 | Bu |
| 2002/0105279 A1 | 8/2002 | Kimura |
| 2002/0117722 A1 | 8/2002 | Osada |
| 2002/0122308 A1 | 9/2002 | Ikeda |
| 2002/0158587 A1 | 10/2002 | Komiya |

(56) References Cited

U.S. PATENT DOCUMENTS

| | | |
|---|---|---|
| 2002/0158666 A1 | 10/2002 | Azami |
| 2002/0158823 A1 | 10/2002 | Zavracky |
| 2002/0167471 A1 | 11/2002 | Everitt |
| 2002/0167474 A1 | 11/2002 | Everitt |
| 2002/0169575 A1 | 11/2002 | Everitt |
| 2002/0180369 A1 | 12/2002 | Koyama |
| 2002/0180721 A1 | 12/2002 | Kimura |
| 2002/0181276 A1 | 12/2002 | Yamazaki |
| 2002/0183945 A1 | 12/2002 | Everitt |
| 2002/0186214 A1 | 12/2002 | Siwinski |
| 2002/0190924 A1 | 12/2002 | Asano |
| 2002/0190971 A1 | 12/2002 | Nakamura |
| 2002/0195967 A1 | 12/2002 | Kim |
| 2002/0195968 A1 | 12/2002 | Sanford |
| 2003/0020413 A1 | 1/2003 | Oomura |
| 2003/0030603 A1 | 2/2003 | Shimoda |
| 2003/0043088 A1 | 3/2003 | Booth |
| 2003/0057895 A1 | 3/2003 | Kimura |
| 2003/0058226 A1 | 3/2003 | Bertram |
| 2003/0062524 A1 | 4/2003 | Kimura |
| 2003/0063081 A1 | 4/2003 | Kimura |
| 2003/0071821 A1 | 4/2003 | Sundahl |
| 2003/0076048 A1 | 4/2003 | Rutherford |
| 2003/0090447 A1 | 5/2003 | Kimura |
| 2003/0090481 A1 | 5/2003 | Kimura |
| 2003/0107560 A1 | 6/2003 | Yumoto |
| 2003/0111966 A1 | 6/2003 | Mikami |
| 2003/0122745 A1 | 7/2003 | Miyazawa |
| 2003/0122749 A1 | 7/2003 | Booth, Jr. |
| 2003/0122813 A1 | 7/2003 | Ishizuki |
| 2003/0142088 A1 | 7/2003 | LeChevalier |
| 2003/0146693 A1* | 8/2003 | Ishihara ............. H01L 27/3276 313/504 |
| 2003/0146897 A1 | 8/2003 | Hunter |
| 2003/0151569 A1 | 8/2003 | Lee |
| 2003/0156101 A1 | 8/2003 | Le Chevalier |
| 2003/0169241 A1 | 9/2003 | LeChevalier |
| 2003/0174152 A1 | 9/2003 | Noguchi |
| 2003/0179626 A1 | 9/2003 | Sanford |
| 2003/0185438 A1 | 10/2003 | Osawa |
| 2003/0197663 A1 | 10/2003 | Lee |
| 2003/0210256 A1 | 11/2003 | Mori |
| 2003/0227253 A1 | 12/2003 | Seo |
| 2003/0230141 A1 | 12/2003 | Gilmour |
| 2003/0230980 A1 | 12/2003 | Forrest |
| 2003/0231148 A1 | 12/2003 | Lin |
| 2004/0032382 A1 | 2/2004 | Cok |
| 2004/0041750 A1 | 3/2004 | Abe |
| 2004/0066357 A1 | 4/2004 | Kawasaki |
| 2004/0070557 A1 | 4/2004 | Asano |
| 2004/0070565 A1 | 4/2004 | Nayar |
| 2004/0090186 A1 | 5/2004 | Kanauchi |
| 2004/0090400 A1 | 5/2004 | Yoo |
| 2004/0095297 A1 | 5/2004 | Libsch |
| 2004/0100427 A1 | 5/2004 | Miyazawa |
| 2004/0108518 A1 | 6/2004 | Jo |
| 2004/0135749 A1 | 7/2004 | Kondakov |
| 2004/0140982 A1 | 7/2004 | Pate |
| 2004/0145547 A1 | 7/2004 | Oh |
| 2004/0150592 A1 | 8/2004 | Mizukoshi |
| 2004/0150594 A1 | 8/2004 | Koyama |
| 2004/0150595 A1 | 8/2004 | Kasai |
| 2004/0155841 A1 | 8/2004 | Kasai |
| 2004/0174347 A1 | 9/2004 | Sun |
| 2004/0174349 A1 | 9/2004 | Libsch |
| 2004/0174354 A1 | 9/2004 | Ono |
| 2004/0178743 A1 | 9/2004 | Miller |
| 2004/0178974 A1 | 9/2004 | Miller |
| 2004/0183759 A1 | 9/2004 | Stevenson |
| 2004/0196275 A1 | 10/2004 | Hattori |
| 2004/0207615 A1 | 10/2004 | Yumoto |
| 2004/0227697 A1 | 11/2004 | Mori |
| 2004/0233125 A1 | 11/2004 | Tanghe |
| 2004/0239596 A1 | 12/2004 | Ono |
| 2004/0246246 A1 | 12/2004 | Tobita |
| 2004/0252089 A1 | 12/2004 | Ono |
| 2004/0256620 A1 | 12/2004 | Yamazaki |
| 2004/0257313 A1 | 12/2004 | Kawashima |
| 2004/0257353 A1 | 12/2004 | Imamura |
| 2004/0257355 A1 | 12/2004 | Naugler |
| 2004/0263437 A1 | 12/2004 | Hattori |
| 2004/0263444 A1 | 12/2004 | Kimura |
| 2004/0263445 A1 | 12/2004 | Inukai |
| 2004/0263541 A1 | 12/2004 | Takeuchi |
| 2005/0007355 A1 | 1/2005 | Miura |
| 2005/0007357 A1 | 1/2005 | Yamashita |
| 2005/0007392 A1 | 1/2005 | Kasai |
| 2005/0017650 A1 | 1/2005 | Fryer |
| 2005/0024081 A1 | 2/2005 | Kuo |
| 2005/0024393 A1 | 2/2005 | Kondo |
| 2005/0030267 A1 | 2/2005 | Tanghe |
| 2005/0057484 A1 | 3/2005 | Diefenbaugh |
| 2005/0057580 A1 | 3/2005 | Yamano |
| 2005/0067970 A1 | 3/2005 | Libsch |
| 2005/0067971 A1 | 3/2005 | Kane |
| 2005/0068270 A1 | 3/2005 | Awakura |
| 2005/0068275 A1 | 3/2005 | Kane |
| 2005/0073264 A1 | 4/2005 | Matsumoto |
| 2005/0074968 A1* | 4/2005 | Chen .................. H01L 21/2855 438/643 |
| 2005/0083323 A1 | 4/2005 | Suzuki |
| 2005/0088103 A1 | 4/2005 | Kageyama |
| 2005/0105031 A1 | 5/2005 | Shih |
| 2005/0110420 A1 | 5/2005 | Arnold |
| 2005/0110807 A1 | 5/2005 | Chang |
| 2005/0122294 A1 | 6/2005 | Ben-David |
| 2005/0140598 A1 | 6/2005 | Kim |
| 2005/0140610 A1 | 6/2005 | Smith |
| 2005/0145891 A1 | 7/2005 | Abe |
| 2005/0156831 A1 | 7/2005 | Yamazaki |
| 2005/0162079 A1 | 7/2005 | Sakamoto |
| 2005/0168416 A1 | 8/2005 | Hashimoto |
| 2005/0179626 A1 | 8/2005 | Yuki |
| 2005/0179628 A1 | 8/2005 | Kimura |
| 2005/0185200 A1 | 8/2005 | Tobol |
| 2005/0200575 A1 | 9/2005 | Kim |
| 2005/0206590 A1 | 9/2005 | Sasaki |
| 2005/0212787 A1 | 9/2005 | Noguchi |
| 2005/0219184 A1 | 10/2005 | Zehner |
| 2005/0225683 A1 | 10/2005 | Nozawa |
| 2005/0248515 A1 | 11/2005 | Naugler |
| 2005/0269959 A1 | 12/2005 | Uchino |
| 2005/0269960 A1 | 12/2005 | Ono |
| 2005/0280615 A1 | 12/2005 | Cok |
| 2005/0280766 A1 | 12/2005 | Johnson |
| 2005/0285822 A1 | 12/2005 | Reddy |
| 2005/0285825 A1 | 12/2005 | Eom |
| 2006/0001613 A1 | 1/2006 | Routley |
| 2006/0007072 A1 | 1/2006 | Choi |
| 2006/0007206 A1 | 1/2006 | Reddy |
| 2006/0007249 A1 | 1/2006 | Reddy |
| 2006/0012310 A1 | 1/2006 | Chen |
| 2006/0012311 A1 | 1/2006 | Ogawa |
| 2006/0015272 A1 | 1/2006 | Giraldo |
| 2006/0022305 A1 | 2/2006 | Yamashita |
| 2006/0022907 A1 | 2/2006 | Uchino |
| 2006/0027807 A1 | 2/2006 | Nathan |
| 2006/0030084 A1 | 2/2006 | Young |
| 2006/0038501 A1 | 2/2006 | Koyama |
| 2006/0038758 A1 | 2/2006 | Routley |
| 2006/0038762 A1 | 2/2006 | Chou |
| 2006/0044227 A1 | 3/2006 | Hadcock |
| 2006/0061248 A1 | 3/2006 | Cok |
| 2006/0066533 A1 | 3/2006 | Sato |
| 2006/0077134 A1 | 4/2006 | Hector |
| 2006/0077135 A1 | 4/2006 | Cok |
| 2006/0077142 A1 | 4/2006 | Kwon |
| 2006/0082523 A1 | 4/2006 | Guo |
| 2006/0092185 A1 | 5/2006 | Jo |
| 2006/0097628 A1 | 5/2006 | Suh |
| 2006/0097631 A1 | 5/2006 | Lee |
| 2006/0103324 A1 | 5/2006 | Kim |
| 2006/0103611 A1 | 5/2006 | Choi |
| 2006/0113900 A1 | 6/2006 | Oh |

(56) References Cited

U.S. PATENT DOCUMENTS

| | | |
|---|---|---|
| 2006/0125740 A1 | 6/2006 | Shirasaki |
| 2006/0149493 A1 | 7/2006 | Sambandan |
| 2006/0170623 A1 | 8/2006 | Naugler, Jr. |
| 2006/0176250 A1 | 8/2006 | Nathan |
| 2006/0208961 A1 | 9/2006 | Nathan |
| 2006/0208971 A1 | 9/2006 | Deane |
| 2006/0214888 A1 | 9/2006 | Schneider |
| 2006/0220543 A1 | 10/2006 | Makiura |
| 2006/0231740 A1 | 10/2006 | Kasai |
| 2006/0232522 A1 | 10/2006 | Roy |
| 2006/0244697 A1 | 11/2006 | Lee |
| 2006/0256048 A1 | 11/2006 | Fish |
| 2006/0261841 A1 | 11/2006 | Fish |
| 2006/0273997 A1 | 12/2006 | Nathan |
| 2006/0279481 A1 | 12/2006 | Haruna |
| 2006/0284801 A1 | 12/2006 | Yoon |
| 2006/0284802 A1 | 12/2006 | Kohno |
| 2006/0284895 A1 | 12/2006 | Marcu |
| 2006/0290614 A1 | 12/2006 | Nathan |
| 2006/0290618 A1 | 12/2006 | Goto |
| 2007/0001937 A1 | 1/2007 | Park |
| 2007/0001939 A1 | 1/2007 | Hashimoto |
| 2007/0008251 A1 | 1/2007 | Kohno |
| 2007/0008268 A1 | 1/2007 | Park |
| 2007/0008297 A1 | 1/2007 | Bassetti |
| 2007/0057873 A1 | 3/2007 | Uchino |
| 2007/0057874 A1 | 3/2007 | Le Roy |
| 2007/0069998 A1 | 3/2007 | Naugler |
| 2007/0075727 A1 | 4/2007 | Nakano |
| 2007/0076226 A1 | 4/2007 | Klompenhouwer |
| 2007/0080905 A1 | 4/2007 | Takahara |
| 2007/0080906 A1 | 4/2007 | Tanabe |
| 2007/0080908 A1 | 4/2007 | Nathan |
| 2007/0097038 A1 | 5/2007 | Yamazaki |
| 2007/0097041 A1 | 5/2007 | Park |
| 2007/0103411 A1 | 5/2007 | Cok |
| 2007/0103419 A1 | 5/2007 | Uchino |
| 2007/0115221 A1 | 5/2007 | Buchhauser |
| 2007/0126672 A1 | 6/2007 | Tada |
| 2007/0164664 A1 | 7/2007 | Ludwicki |
| 2007/0164937 A1 | 7/2007 | Jung |
| 2007/0164938 A1 | 7/2007 | Shin |
| 2007/0182671 A1 | 8/2007 | Nathan |
| 2007/0195020 A1 | 8/2007 | Nathan |
| 2007/0236134 A1 | 10/2007 | Ho |
| 2007/0236440 A1 | 10/2007 | Wacyk |
| 2007/0236517 A1 | 10/2007 | Kimpe |
| 2007/0241999 A1 | 10/2007 | Lin |
| 2007/0273294 A1 | 11/2007 | Nagayama |
| 2007/0285359 A1 | 12/2007 | Ono |
| 2007/0290957 A1 | 12/2007 | Cok |
| 2007/0290958 A1 | 12/2007 | Cok |
| 2007/0296672 A1 | 12/2007 | Kim |
| 2008/0001525 A1 | 1/2008 | Chao |
| 2008/0001544 A1 | 1/2008 | Murakami |
| 2008/0030518 A1 | 2/2008 | Higgins |
| 2008/0036706 A1 | 2/2008 | Kitazawa |
| 2008/0036708 A1 | 2/2008 | Shirasaki |
| 2008/0042942 A1 | 2/2008 | Takahashi |
| 2008/0042948 A1 | 2/2008 | Yamashita |
| 2008/0048951 A1 | 2/2008 | Naugler, Jr. |
| 2008/0055209 A1 | 3/2008 | Cok |
| 2008/0055211 A1 | 3/2008 | Ogawa |
| 2008/0074413 A1 | 3/2008 | Ogura |
| 2008/0088549 A1 | 4/2008 | Nathan |
| 2008/0088648 A1 | 4/2008 | Nathan |
| 2008/0111766 A1 | 5/2008 | Uchino |
| 2008/0116787 A1 | 5/2008 | Hsu |
| 2008/0117144 A1 | 5/2008 | Nakano et al. |
| 2008/0136770 A1 | 6/2008 | Peker |
| 2008/0150845 A1 | 6/2008 | Ishii |
| 2008/0150847 A1 | 6/2008 | Kim |
| 2008/0158115 A1 | 7/2008 | Cordes |
| 2008/0158648 A1 | 7/2008 | Cummings |
| 2008/0191976 A1 | 8/2008 | Nathan |
| 2008/0198103 A1 | 8/2008 | Toyomura |
| 2008/0211749 A1 | 9/2008 | Weitbruch |
| 2008/0218451 A1 | 9/2008 | Miyamoto |
| 2008/0231558 A1 | 9/2008 | Naugler |
| 2008/0231562 A1 | 9/2008 | Kwon |
| 2008/0231625 A1 | 9/2008 | Minami |
| 2008/0246713 A1 | 10/2008 | Lee |
| 2008/0252223 A1 | 10/2008 | Toyoda |
| 2008/0252571 A1 | 10/2008 | Hente |
| 2008/0259020 A1 | 10/2008 | Fisekovic |
| 2008/0284768 A1 | 11/2008 | Yoshida et al. |
| 2008/0290805 A1 | 11/2008 | Yamada |
| 2008/0297055 A1 | 12/2008 | Miyake |
| 2008/0311692 A1 | 12/2008 | Lee |
| 2009/0015148 A1 | 1/2009 | Hanari |
| 2009/0033598 A1 | 2/2009 | Suh |
| 2009/0058772 A1 | 3/2009 | Lee |
| 2009/0109142 A1 | 4/2009 | Takahara |
| 2009/0121994 A1 | 5/2009 | Miyata |
| 2009/0146926 A1 | 6/2009 | Sung |
| 2009/0146930 A1 | 6/2009 | Nishimura |
| 2009/0160743 A1 | 6/2009 | Tomida |
| 2009/0174628 A1 | 7/2009 | Wang |
| 2009/0184901 A1 | 7/2009 | Kwon |
| 2009/0195483 A1 | 8/2009 | Naugler, Jr. |
| 2009/0201281 A1 | 8/2009 | Routley |
| 2009/0206764 A1 | 8/2009 | Schemmann |
| 2009/0207160 A1 | 8/2009 | Shirasaki |
| 2009/0213046 A1 | 8/2009 | Nam |
| 2009/0244046 A1 | 10/2009 | Seto |
| 2009/0262047 A1 | 10/2009 | Yamashita |
| 2010/0004891 A1 | 1/2010 | Ahlers |
| 2010/0026725 A1 | 2/2010 | Smith |
| 2010/0039422 A1 | 2/2010 | Seto |
| 2010/0039458 A1 | 2/2010 | Nathan |
| 2010/0045646 A1 | 2/2010 | Kishi |
| 2010/0045650 A1 | 2/2010 | Fish |
| 2010/0060153 A1 | 3/2010 | Uchida |
| 2010/0060911 A1 | 3/2010 | Marcu |
| 2010/0073335 A1 | 3/2010 | Min |
| 2010/0073357 A1 | 3/2010 | Min |
| 2010/0079419 A1 | 4/2010 | Shibusawa |
| 2010/0085282 A1 | 4/2010 | Yu |
| 2010/0103160 A1 | 4/2010 | Jeon |
| 2010/0134469 A1 | 6/2010 | Ogura |
| 2010/0134475 A1 | 6/2010 | Ogura |
| 2010/0165002 A1 | 7/2010 | Ahn |
| 2010/0194670 A1 | 8/2010 | Cok |
| 2010/0207960 A1 | 8/2010 | Kimpe |
| 2010/0225630 A1 | 9/2010 | Levey |
| 2010/0251295 A1 | 9/2010 | Amento |
| 2010/0277400 A1 | 11/2010 | Jeong |
| 2010/0315319 A1 | 12/2010 | Cok |
| 2011/0032232 A1 | 2/2011 | Smith |
| 2011/0050870 A1 | 3/2011 | Hanari |
| 2011/0063197 A1 | 3/2011 | Chung |
| 2011/0069051 A1 | 3/2011 | Nakamura |
| 2011/0069089 A1 | 3/2011 | Kopf |
| 2011/0069094 A1 | 3/2011 | Knapp |
| 2011/0069096 A1 | 3/2011 | Li |
| 2011/0074750 A1 | 3/2011 | Leon |
| 2011/0074762 A1 | 3/2011 | Shirasaki |
| 2011/0109610 A1 | 5/2011 | Yamamoto |
| 2011/0149166 A1 | 6/2011 | Botzas |
| 2011/0169798 A1 | 7/2011 | Lee |
| 2011/0175895 A1 | 7/2011 | Hayakawa |
| 2011/0181630 A1 | 7/2011 | Smith |
| 2011/0199395 A1 | 8/2011 | Nathan |
| 2011/0227964 A1 | 9/2011 | Chaji |
| 2011/0242074 A1 | 10/2011 | Bert |
| 2011/0273399 A1 | 11/2011 | Lee |
| 2011/0279488 A1 | 11/2011 | Nathan |
| 2011/0292006 A1 | 12/2011 | Kim |
| 2011/0293480 A1 | 12/2011 | Mueller |
| 2012/0056558 A1 | 3/2012 | Toshiya |
| 2012/0062565 A1 | 3/2012 | Fuchs |
| 2012/0262184 A1 | 10/2012 | Shen |
| 2012/0299970 A1 | 11/2012 | Bae |
| 2012/0299973 A1 | 11/2012 | Jaffari |

(56) References Cited

U.S. PATENT DOCUMENTS

| | | |
|---|---|---|
| 2012/0299978 A1 | 11/2012 | Chaji |
| 2013/0002527 A1 | 1/2013 | Kim |
| 2013/0027381 A1 | 1/2013 | Nathan |
| 2013/0057595 A1 | 3/2013 | Nathan |
| 2013/0112960 A1 | 5/2013 | Chaji |
| 2013/0135272 A1 | 5/2013 | Park |
| 2013/0162617 A1 | 6/2013 | Yoon |
| 2013/0201223 A1 | 8/2013 | Li |
| 2013/0221381 A1* | 8/2013 | Shin .............. H01L 27/1255 257/88 |
| 2013/0241813 A1 | 9/2013 | Tanaka |
| 2013/0309821 A1 | 11/2013 | Yoo |
| 2013/0321671 A1 | 12/2013 | Cote |
| 2013/0328040 A1 | 12/2013 | Yokoyama |
| 2014/0015824 A1 | 1/2014 | Chaji |
| 2014/0022289 A1 | 1/2014 | Lee |
| 2014/0043316 A1 | 2/2014 | Chaji |
| 2014/0055500 A1 | 2/2014 | Lai |
| 2014/0111567 A1 | 4/2014 | Nathan |
| 2014/0346484 A1 | 11/2014 | Nendai |
| 2016/0275860 A1 | 9/2016 | Wu |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 432 530 | 7/2002 |
| CA | 2 436 451 | 8/2002 |
| CA | 2 438 577 | 8/2002 |
| CA | 2 463 653 | 1/2004 |
| CA | 2 498 136 | 3/2004 |
| CA | 2 522 396 | 11/2004 |
| CA | 2 443 206 | 3/2005 |
| CA | 2 472 671 | 12/2005 |
| CA | 2 567 076 | 1/2006 |
| CA | 2526436 | 2/2006 |
| CA | 2 526 782 | 4/2006 |
| CA | 2 541 531 | 7/2006 |
| CA | 2 550 102 | 4/2008 |
| CA | 2 773 699 | 10/2013 |
| CN | 1381032 | 11/2002 |
| CN | 1448908 | 10/2003 |
| CN | 1538377 A | 10/2004 |
| CN | 1623180 A | 6/2005 |
| CN | 1682267 A | 10/2005 |
| CN | 1758309 A | 4/2006 |
| CN | 1760945 | 4/2006 |
| CN | 1886774 | 12/2006 |
| CN | 1897093 A | 7/2007 |
| CN | 100375141 C | 3/2008 |
| CN | 101194300 A | 6/2008 |
| CN | 101449311 | 6/2009 |
| CN | 101615376 | 12/2009 |
| CN | 101923828 A | 12/2010 |
| CN | 102414737 A | 4/2012 |
| CN | 102656621 | 9/2012 |
| CN | 102725786 A | 10/2012 |
| CN | 102741910 A | 10/2012 |
| CN | 103280162 A | 9/2013 |
| EP | 0 158 366 | 10/1985 |
| EP | 1 028 471 | 8/2000 |
| EP | 1 111 577 | 6/2001 |
| EP | 1 130 565 A1 | 9/2001 |
| EP | 1 194 013 | 4/2002 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 145 0341 A | 8/2004 |
| EP | 1 465 143 A | 10/2004 |
| EP | 1 469 448 A | 10/2004 |
| EP | 1 521 203 A2 | 4/2005 |
| EP | 1 594 347 | 11/2005 |
| EP | 1 784 055 A2 | 5/2007 |
| EP | 1854338 A1 | 11/2007 |
| EP | 1 879 169 A1 | 1/2008 |
| EP | 1 879 172 A1 | 1/2008 |
| EP | 2395499 A1 | 12/2011 |
| GB | 2 389 951 | 12/2003 |
| JP | 1272298 | 10/1989 |
| JP | 4-042619 | 2/1992 |
| JP | 6-314977 | 11/1994 |
| JP | 8-340243 | 12/1996 |
| JP | 09-090405 | 4/1997 |
| JP | 10-254410 | 9/1998 |
| JP | 11-202295 | 7/1999 |
| JP | 11-219146 | 8/1999 |
| JP | 11 231805 | 8/1999 |
| JP | 11-282419 | 10/1999 |
| JP | 2000-056847 | 2/2000 |
| JP | 2000-81607 | 3/2000 |
| JP | 2001-134217 | 5/2001 |
| JP | 2001-195014 | 7/2001 |
| JP | 2002-055654 | 2/2002 |
| JP | 2002-91376 | 3/2002 |
| JP | 2002-514320 | 5/2002 |
| JP | 2002-229513 | 8/2002 |
| JP | 2002-278513 | 9/2002 |
| JP | 2002-333862 | 11/2002 |
| JP | 2003-076331 | 3/2003 |
| JP | 2003-124519 | 4/2003 |
| JP | 2003-177709 | 6/2003 |
| JP | 2003-271095 | 9/2003 |
| JP | 2003-308046 | 10/2003 |
| JP | 2003-317944 | 11/2003 |
| JP | 2004-004675 | 1/2004 |
| JP | 2004-045648 | 2/2004 |
| JP | 2004-145197 | 5/2004 |
| JP | 2004-287345 | 10/2004 |
| JP | 2005-057217 | 3/2005 |
| JP | 2007-065015 | 3/2007 |
| JP | 2007-155754 | 6/2007 |
| JP | 2007-206590 A | 8/2007 |
| JP | 2008-102335 | 5/2008 |
| JP | 4-158570 | 10/2008 |
| JP | 2003-195813 | 7/2013 |
| KR | 2004-0100887 | 12/2004 |
| TW | 342486 | 10/1998 |
| TW | 473622 | 1/2002 |
| TW | 485337 | 5/2002 |
| TW | 502233 | 9/2002 |
| TW | 538650 | 6/2003 |
| TW | 1221268 | 9/2004 |
| TW | 1223092 | 11/2004 |
| TW | 200727247 | 7/2007 |
| WO | WO 1998/48403 | 10/1998 |
| WO | WO 1999/48079 | 9/1999 |
| WO | WO 2001/06484 | 1/2001 |
| WO | WO 2001/27910 A1 | 4/2001 |
| WO | WO 2001/63587 A2 | 8/2001 |
| WO | WO 2002/067327 A | 8/2002 |
| WO | WO 2003/001496 A1 | 1/2003 |
| WO | WO 2003/034389 A | 4/2003 |
| WO | WO 2003/058594 A1 | 7/2003 |
| WO | WO 2003/063124 | 7/2003 |
| WO | WO 2003/077231 | 9/2003 |
| WO | WO 2004/003877 | 1/2004 |
| WO | WO 2004/025615 A | 3/2004 |
| WO | WO 2004/034364 | 4/2004 |
| WO | WO 2004/047058 | 6/2004 |
| WO | WO 2004/066249 A1 | 8/2004 |
| WO | WO 2004/104975 A1 | 12/2004 |
| WO | WO 2005/022498 | 3/2005 |
| WO | WO 2005/022500 A | 3/2005 |
| WO | WO 2005/029455 | 3/2005 |
| WO | WO 2005/029456 | 3/2005 |
| WO | WO/2005/034072 A1 | 4/2005 |
| WO | WO 2005/055185 | 6/2005 |
| WO | WO 2006/000101 A1 | 1/2006 |
| WO | WO 2006/053424 | 5/2006 |

(56) References Cited

FOREIGN PATENT DOCUMENTS

| WO | WO 2006/063448 A | 6/2006 |
|---|---|---|
| WO | WO 2006/084360 | 8/2006 |
| WO | WO 2007/003877 A | 1/2007 |
| WO | WO 2007/079572 | 7/2007 |
| WO | WO 2007/090287 A1 | 8/2007 |
| WO | WO 2007/120849 A2 | 10/2007 |
| WO | WO 2009/048618 | 4/2009 |
| WO | WO 2009/055920 | 5/2009 |
| WO | WO 2009/127065 | 10/2009 |
| WO | WO 2010/023270 | 3/2010 |
| WO | WO 2010/146707 A1 | 12/2010 |
| WO | WO 2011/041224 A1 | 4/2011 |
| WO | WO 2011/064761 A1 | 6/2011 |
| WO | WO 2011/067729 | 6/2011 |
| WO | WO 2012/160424 A1 | 11/2012 |
| WO | WO 2012/160471 | 11/2012 |
| WO | WO 2012/164474 A2 | 12/2012 |
| WO | WO 2012/164475 A2 | 12/2012 |

OTHER PUBLICATIONS

Alexander : "Pixel circuits and drive schemes for glass and elastic AMOLED displays"; dated Jul. 2005 (9 pages).
Alexander : "Unique Electrical Measurement Technology for Compensation Inspection and Process Diagnostics of AMOLED HDTV"; dated May 2010 (4 pages).
Ashtiani : "AMOLED Pixel Circuit With Electronic Compensation of Luminance Degradation"; dated Mar. 2007 (4 pages).
Chaji : "A Current-Mode Comparator for Digital Calibration of Amorphous Silicon Amoled Displays"; dated Jul. 2008 (5 pages).
Chaji : "A fast settling current driver based on the CCII for AMOLED displays"; dated Dec. 2009 (6 pages).
Chaji : "A Low-Cost Stable Amorphous Silicon AMOLED Display with Full V~T- and V~O~L~E~D Shift Compensation"; dated May 2007 (4 pages).
Chaji : "A low-power driving scheme for a-Si:H active-matrix organic light-emitting diode displays"; dated Jun. 2005 (4 pages).
Chaji : "A low-power high-performance digital circuit for deep submicron technologies"; dated Jun. 2005 (4 pages).
Chaji : "A novel a-Si:H AMOLED pixel circuit based on short-term stress stability of a-Si:H TFTs"; dated Oct. 2005 (3 pages).
Chaji : "A Novel Driving Scheme and Pixel Circuit for AMOLED Displays"; dated Jun. 2006 (4 pages).
Chaji : "A Novel Driving Scheme for High Resolution Large-area a-Si:H AMOLED displays"; dated Aug. 2005 (3 pages).
Chaji : "A Stable Voltage-Programmed Pixel Circuit for a-Si:H AMOLED Displays"; dated Dec. 2006 (12 pages).
Chaji : "A Sub-µA fast-settling current-programmed pixel circuit for AMOLED displays"; dated Sep. 2007.
Chaji : "An Enhanced and Simplified Optical Feedback Pixel Circuit for AMOLED Displays"; dated Oct. 2006.
Chaji : "Compensation technique for DC and transient instability of thin film transistor circuits for large-area devices"; dated Aug. 2008.
Chaji : "Driving scheme for stable operation of 2-TFT a-Si AMOLED pixel"; dated Apr. 2005 (2 pages).
Chaji : "Dynamic-effect compensating technique for stable a-Si:H AMOLED displays";dated Aug. 2005 (4 pages).
Chaji : "Electrical Compensation of OLED Luminance Degradation"; dated Dec. 2007 (3 pages).
Chaji : "eUTDSP: a design study of a new VLIW-based DSP architecture"; dated May 2003 (4 pages).
Chaji : "Fast and Offset-Leakage Insensitive Current-Mode Line Driver for Active Matrix Displays and Sensors"; dated Feb. 2009 (8 pages).
Chaji : "High Speed Low Power Adder Design With a New Logic Style: Pseudo Dynamic Logic (SDL)"; dated Oct. 2001 (4 pages).
Chaji : "High-precision fast current source for large-area current-programmed a-Si flat panels"; dated Sep. 2006 (4 pages).
Chaji : "Low-Cost AMOLED Television with IGNIS Compensating Technology"; dated May 2008 (4 pages).

Chaji : "Low-Cost Stable a-Si:H AMOLED Display for Portable Applications"; dated Jun. 2006 (4 pages).
Chaji : "Low-Power Low-Cost Voltage-Programmed a-Si:H AMOLED Display"; dated Jun. 2008 (5 pages).
Chaji : "Merged phototransistor pixel with enhanced near infrared response and flicker noise reduction for biomolecular imaging"; dated Nov. 2008 (3 pages).
Chaji : "Parallel Addressing Scheme for Voltage-Programmed Active-Matrix OLED Displays"; dated May 2007 (6 pages).
Chaji : "Pseudo dynamic logic (SDL): a high-speed and low-power dynamic logic family"; dated 2002 (4 pages).
Chaji : "Stable a-Si:H circuits based on short-term stress stability of amorphous silicon thin film transistors"; dated May 2006 (4 pages).
Chaji : "Stable Pixel Circuit for Small-Area High- Resolution a-Si:H AMOLED Displays"; dated Oct. 2008 (6 pages).
Chaji : "Stable RGBW AMOLED display with OLED degradation compensation using electrical feedback"; dated Feb. 2010 (2 pages).
Chaji : "Thin-Film Transistor Integration for Biomedical Imaging and AMOLED Displays"; dated 2008 (177 pages).
European Search Report for Application No. EP 04 78 6661 dated Mar. 9, 2009.
European Search Report for Application No. EP 05 75 9141 dated Oct. 30, 2009 (2 pages).
European Search Report for Application No. EP 05 81 9617 dated Jan. 30, 2009.
European Search Report for Application No. EP 06 70 5133 dated Jul. 18, 2008.
European Search Report for Application No. EP 06 72 1798 dated Nov. 12, 2009 (2 pages).
European Search Report for Application No. EP 07 71 0608.6 dated Mar. 19, 2010 (7 pages).
European Search Report for Application No. EP 07 71 9579 dated May 20, 2009.
European Search Report for Application No. EP 07 81 5784 dated Jul. 20, 2010 (2 pages).
European Search Report for Application No. EP 10 16 6143 dated Sep. 3, 2010 (2 pages).
European Search Report for Application No. EP 10 83 4294.0-1903 dated Apr. 8, 2013 (9 pages).
European Supplementary Search Report for Application No. EP 04 78 6662 dated Jan. 19, 2007 (2 pages).
Extended European Search Report for Application No. 11 73 9485.8 dated Aug. 6, 2013 (14 pages).
Extended European Search Report for Application No. EP 09 73 3076.5 dated Apr. 27, 2011 (13 pages).
Extended European Search Report for Application No. EP 11 16 8677.0 dated Nov. 29, 2012 (13 page).
Extended European Search Report for Application No. EP 11 19 1641.7 dated Jul. 11, 2012 (14 pages).
Extended European Search Report for Application No. EP 10834297 dated Oct. 27, 2014 (6 pages).
Fossum Eric R.. "Active Pixel Sensors: Are CCD's Dinosaurs?" SPIE: Symposium on Electronic Imaging. Feb. 1, 1993 (13 pages).
GOH "A New a-Si:H Thin-Film Transistor Pixel Circuit for Active-Matrix Organic Light-Emitting Diodes" IEEE Electron Device Letters vol. 24 No. 9 Sep. 2003 pp. 583-585.
International Preliminary Report on Patentability for Application No. PCT/CA2005/001007 dated Oct. 16, 2006 4 pages.
International Search Report for Application No. PCT/CA2004/001741 dated Feb. 21, 2005.
International Search Report for Application No. PCT/CA2004/001742 Canadian Patent Office dated Feb. 21, 2005 (2 pages).
International Search Report for Application No. PCT/CA2005/001007 dated Oct. 18, 2005.
International Search Report for Application No. PCT/CA2005/001897 dated Mar. 21, 2006 (2 pages).
International Search Report for Application No. PCT/CA2007/000652 dated Jul. 25, 2007.
International Search Report for Application No. PCT/CA2009/000501 dated Jul. 30, 2009 (4 pages).
International Search Report for Application No. PCT/CA2009/001769 dated Apr. 8, 2010 (3 pages).

(56) References Cited

OTHER PUBLICATIONS

International Search Report for Application No. PCT/IB2010/055481 dated Apr. 7, 2011 3 pages.
International Search Report for Application No. PCT/IB2010/055486 dated Apr. 19, 2011 5 pages.
International Search Report for Application No. PCT/IB2014/060959 dated Aug. 28, 2014 5 pages.
International Search Report for Application No. PCT/IB2010/055541 filed Dec. 1, 2010 dated May 26, 2011; 5 pages
International Search Report for Application No. PCT/IB2011/050502 dated Jun. 27, 2011 (6 pages).
International Search Report for Application No. PCT/IB2011/051103 dated Jul. 8, 2011 3 pages.
International Search Report for Application No. PCT/IB2011/055135 Canadian Patent Office dated Apr. 16, 2012 (5 pages).
International Search Report for Application No. PCT/IB2012/052372 dated Sep. 12, 2012 (3 pages).
International Search Report for Application No. PCT/IB2013/054251 Canadian Intellectual Property Office dated Sep. 11, 2013; (4 pages).
International Search Report for Application No. PCT/JP02/09668 dated Dec. 3, 2002 (4 pages).
International Written Opinion for Application No. PCT/CA2004/001742 Canadian Patent Office dated Feb. 21, 2005 (5 pages).
International Written Opinion for Application No. PCT/CA2005/001897 dated Mar. 21, 2006 (4 pages).
International Written Opinion for Application No. PCT/CA2009/000501 dated Jul. 30, 2009 (6 pages).
International Written Opinion for Application No. PCT/IB2010/055481 dated Apr. 7, 2011 6 pages.
International Written Opinion for Application No. PCT/IB2010/055486 dated Apr. 19, 2011 8 pages.
International Written Opinion for Application No. PCT/IB2010/055541 dated May 26, 2011; 6 pages.
International Written Opinion for Application No. PCT/IB2011/050502 dated Jun. 27, 2011 (7 pages).
International Written Opinion for Application No. PCT/IB2011/051103 dated Jul. 8, 2011 6 pages.
International Written Opinion for Application No. PCT/IB2011/055135 Canadian Patent Office dated Apr. 16, 2012 (5 pages).
International Written Opinion for Application No. PCT/IB2012/052372 dated Sep. 12, 2012 (6 pages).
International Written Opinion for Application No. PCT/IB2013/054251 Canadian Intellectual Property Office dated Sep. 11, 2013; (5 pages).
Jafarabadiashtiani : "A New Driving Method for a-Si AMOLED Displays Based on Voltage Feedback"; dated 2005 (4 pages).
Kanicki J. "Amorphous Silicon Thin-Film Transistors Based Active-Matrix Organic Light-Emitting Displays." Asia Display: International Display Workshops Sep. 2001 (pp. 315-318).
Karim K. S. "Amorphous Silicon Active Pixel Sensor Readout Circuit for Digital Imaging." IEEE: Transactions on Electron Devices. vol. 50 No. 1 Jan. 2003 (pp. 200208).
Lee : "Ambipolar Thin-Film Transistors Fabricated by PECVD Nanocrystalline Silicon"; dated 2006.
Lee Wonbok: "Thermal Management in Microprocessor Chips and Dynamic Backlight Control in Liquid Crystal Displays" Ph.D. Dissertation University of Southern California (124 pages).
Liu P. Innovative Voltage Driving Pixel Circuit Using Organic Thin-Film Transistor for AMOLEDs Journal of Display Technology vol. 5 Issue 6 Jun. 2009 (pp. 224-227).
Ma E Y: "organic light emitting diode/thin film transistor integration for foldable displays" dated Sep. 15 1997(4 pages).
Matsueda y : "35.1: 2.5-in. AMOLED with Integrated 6-bit Gamma Compensated Digital Data Driver"; dated May 2004.
Mendes E. "A High Resolution Switch-Current Memory Base Cell." IEEE: Circuits and Systems. vol. 2 Aug. 1999 (pp. 718-721).
Nathan A. "Thin Film imaging technology on glass and plastic" ICM 2000 proceedings of the 12 international conference on microelectronics dated Oct. 31, 2001 (4 pages).

Nathan "Amorphous Silicon Thin Film Transistor Circuit Integration for Organic LED Displays on Glass and Plastic" IEEE Journal of Solid-State Circuits vol. 39 No. 9 Sep. 2004 pp. 1477-1486.
Nathan : "Backplane Requirements for active Matrix Organic Light Emitting Diode Displays"; dated 2006 (16 pages).
Nathan : "Call for papers second international workshop on compact thin-film transistor (TFT) modeling for circuit simulation"; dated Sep. 2009 (1 page).
Nathan : "Driving schemes for a-Si and LTPS AMOLED displays"; dated Dec. 2005 (11 pages).
Nathan : "Invited Paper: a-Si for AMOLED—Meeting the Performance and Cost Demands of Display Applications (Cell Phone to HDTV)"; dated 2006 (4 pages).
Office Action in Japanese patent application No. JP2012-541612 dated Jul. 15, 2014. (3 pages).
Partial European Search Report for Application No. EP 11 168 677.0 dated Sep. 22, 2011 (5 pages).
Partial European Search Report for Application No. EP 11 19 1641.7 dated Mar. 20, 2012 (8 pages).
Philipp: "Charge transfer sensing" SENSOR Review vol. 19 No. 2 Dec. 31, 1999 (Dec. 31, 1999) 10 pages.
Rafati : "Comparison of a 17 b multiplier in Dual-rail domino and in Dual-rail D L (D L) logic styles"; dated 2002 (4 pages).
Safavian : "3-TFT active pixel sensor with correlated double sampling readout circuit for real-time medical x-ray imaging"; dated Jun. 2006 (4 pages).
Safavian : "A novel current scaling active pixel sensor with correlated double sampling readout circuit for real time medical x-ray imaging"; dated May 2007 (7 pages).
Safavian : "A novel hybrid active-passive pixel with correlated double sampling CMOS readout circuit for medical x-ray imaging"; dated May 2008 (4 pages).
Safavian : "Self-compensated a-Si:H detector with current-mode readout circuit for digital X-ray fluoroscopy"; dated Aug. 2005 (4 pages).
Safavian : "TFT active image sensor with current-mode readout circuit for digital x-ray fluoroscopy [5969D-82]"; dated Sep. 2005 (9 pages).
Safavian : "Three-TFT image sensor for real-time digital X-ray imaging"; dated Feb. 2, 2006 (2 pages).
Singh "Current Conveyor: Novel Universal Active Block" Samriddhi S-JPSET vol. I Issue 1 2010 pp. 41-48 (12EPPT).
Smith Lindsay I. "A tutorial on Principal Components Analysis" dated Feb. 26, 2001 (27 pages).
Spindler System Considerations for RGBW OLED Displays Journal of the SID 14/1 2006 pp. 37-48.
Snorre Aunet: "switched capacitors circuits" University of Oslo Mar. 7, 2011 (Mar. 7, 2011) XP002729694 Retrieved from the Internet: URL:http://www.uio.no/studier/emner/matnat/ifi/INF4420/v11/undervisningsmateriale/INF4420_V11_0308_1.pdf [retrieved on Sep. 9, 2014].
Stewart M. "polysilicon TFT technology for active matrix oled displays" IEEE transactions on electron devices vol. 48 No. 5 dated May 2001 (7 pages).
Vygranenko : "Stability of indium-oxide thin-film transistors by reactive ion beam assisted deposition"; dated 2009.
Wang : "Indium oxides by reactive ion beam assisted evaporation: From material study to device application"; dated Mar. 2009 (6 pages).
Yi He "Current-Source a-Si:H Thin Film Transistor Circuit for Active-Matrix Organic Light-Emitting Displays" IEEE Electron Device Letters vol. 21 No. 12 Dec. 2000 pp. 590-592.
Yu Jennifer: "Improve OLED Technology for Display" Ph.D. Dissertation Massachusetts Institute of Technology Sep. 2008 (151 pages).
International Search Report for Application No. PCT/IB2014/058244 Canadian Intellectual Property Office dated Apr. 11, 2014; (6 pages).
International Search Report for Application No. PCT/IB2014/059753 Canadian Intellectual Property Office dated Jun. 23, 2014; (6 pages).
Written Opinion for Application No. PCT/IB2014/059753 Canadian Intellectual Property Office dated Jun. 12, 2014 (6 pages).

(56) References Cited

OTHER PUBLICATIONS

International Search Report for Application No. PCT/IB2014/060879 Canadian Intellectual Property Office dated Jul. 17, 2014 (3 pages).
Extended European Search Report for Application No. EP 14158051.4 dated Jul. 29, 2014 (4 pages).
Office Action in Chinese Patent Invention No. 201180008188.9 dated Jun. 4, 2014 (17 pages) (w/English translation).
International Search Report for Application No. PCT/IB/2014/066932 dated Mar. 24, 2015.
Written Opinion for Application No. PCT/IB/2014/066932 dated Mar. 24, 2015.
Extended European Search Report for Application No. EP 11866291.5 dated Mar. 9, 2015 (9 pages).
Extended European Search Report for Application No. EP 14181848.4 dated Mar. 5, 2015 (8 pages).
Office Action in Chinese Patent Invention No. 201280022957.5 dated Jun. 26, 2015 (7 pages).
Extended European Search Report for Application No. EP 13794695.0 dated Dec. 18, 2015 (9 pages).
Extended European Search Report for Application No. EP 16157746.5 dated Apr. 8, 2016 (11 pages).
Extended European Search Report for Application No. EP 16192749.6 dated Dec. 15, 2016 (17 pages).
International Search Report for Application No. PCT/IB/2016/054763 dated Nov. 25, 2016 (4 pages).
Written Opinion for Application No. PCT/IB/2016/054763 dated Nov. 25, 2016 (9 pages).
Extended European Search Report for Application No. EP 17195377.1 dated Feb. 12, 2018 (8 pages).
Extended European Search Report for Application No. EP 18150300.4 dated Mar. 14, 2018 (11 pages).

\* cited by examiner

ELECTRODE CONTACTS

CROSS-REFERENCE TO RELATED APPLICATION

This application is a continuation of U.S. patent application Ser. No. 15/793,032, filed Oct. 25, 2017, which is a continuation of U.S. patent application Ser. No. 15/296,424, filed Oct. 18, 2016, now U.S. Pat. No. 9,831,462, which is a continuation of application Ser. No. 14/581,193 filed Dec. 23, 2014, now U.S. Pat. No. 9,502,653, which claims the benefit of U.S. Provisional Patent Application Nos. 61/929, 699, filed Jan. 21, 2014, and 61/920,732, filed Dec. 25, 2013, each of which is hereby incorporated by reference in its entirety.

TECHNICAL FIELD

In array devices with a common-electrode, the resistance of the common electrode can affect the quality of the device performance. In the case of top emission displays, the top electrode needs to be transparent. One method to fabricate a transparent electrode is to use very thin electrodes. However, this results in higher resistivity which can be an issue for large area devices. In one method, the top electrode can be contacted to a conductive layer. However, developing a contact opening is very challenging since a shadow mask needs to be used to remove the semiconductor layer from the opening.

Thus, there is a need of developing contact to conductive layers without using a shadow mask for common-electrode devices. There is also a need to reduce the resistivity of an electrode to prevent a large voltage drop in a device.

SUMMARY

According to one example, a device structure providing contact to conductive layers via a deep trench structure is disclosed. The device structure includes a first dielectric layer including a first opening. The first opening has walls on the first dielectric layer. A first conductive layer is deposited over the first dielectric layer and the first opening. A second dielectric layer is deposited on the first conductive layer. The second dielectric layer includes a second opening having walls on the second dielectric layer. A second conductive layer is deposited over the second dielectric layer and the first and second openings. A semiconductor layer is deposited on the second dielectric layer such that the semiconductor layer is not continuous on at least part of the walls of the first or second openings. A top electrode layer is deposited on the semiconductor layer. The top electrode layer is in contact with the second conductive layer on at least part of the walls of the first or second openings.

Another example is a method of method of fabricating a device structure providing contact to conductive layers via a deep trench structure. The method includes depositing a first dielectric layer and creating a first opening in the first dielectric layer. The first opening has walls on the first dielectric layer. A first conductive layer is deposited over the first dielectric layer and the first opening. A second dielectric layer is deposited on the first conductive layer. A second opening is created on the second dielectric layer. The second opening has walls on the second dielectric layer. A second conductive layer is deposited over the second dielectric layer and the first and second openings. A semiconductor layer is deposited on the second dielectric layers such that the semiconductor layer is not continuous on at least part of the walls of the first or second opening. A top electrode layer is deposited on the semiconductor layer. The top electrode is in contact with the second conductive layer on at least part of the walls of the first or second opening.

Another example is a low resistance device including a backplane layer and a low resistance conductor layer having a pattern with a plurality of edges on the backplane layer. A semiconductor layer is deposited on the low resistance conductor layer. A high-resistance top conductor layer is deposited on the semiconductor layer. The high-resistance top conductor layer is in contact with the low resistance conductor layer on at least one of the plurality of edges.

Another example is a method of forming a low resistance device. The method includes forming a backplane and depositing a low-resistance conductive layer on the backplane. The low-resistance conductive layer is patterned to create a plurality of edges in the low-resistance conductive layer. A semiconductor layer is deposited on the low resistance conductor layer. A high-resistance top conductor layer is deposited on the semiconductor layer. The high-resistance top conductor layer is in contact with the low resistance conductor layer on at least one of the plurality of edges.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages of the invention will become apparent upon reading the following detailed description and upon reference to the drawings.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 1:
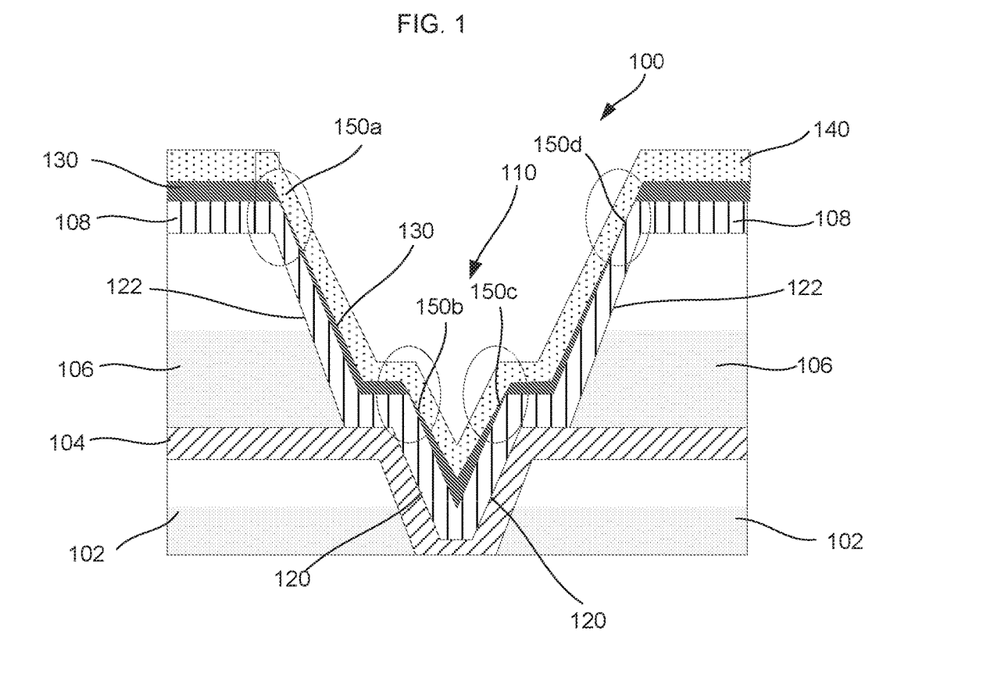
FIG. 1 is a cross-sectional view of a semiconductor device structure with contacts to a common electrode.

FIG. 1 is a cross-section view of an example structure to allow connection of a top electrode to electrodes. The structure 100 in FIG. 1 may be part of a semi-conductor device including transistors and other components requiring electrical connection. The structure 100 includes a first dielectric layer 102. A first conductive layer 104 is formed on the first dielectric layer 102. A second dielectric layer 106 is formed on the first conductive layer 104. A deep trench 110 is formed in the dielectric layers 102 and 106. A second conductive layer 108 is formed over the second dielectric layer 106.

As may be seen in FIG. 1, the trench 110 bisects the first dielectric layer 102 and the conductive layer 102 is located over sidewalls 120 of the first dielectric layer 102. The second conductive layer 108 is located over sidewalls 122 of the second dielectric layer 106 and also may be in contact with the first conductive layer 104.

A semiconductor layer 130 may be fabricated over the second conductive layer 108 and partially over the walls of the trench 110 that are covered by the second conductive layer 108. A top electrode layer 140 is formed over the semiconductor layer 130. The electrode layer 140 is formed on the walls of the trench 110. The electrode layer 140 contacts the second conductive layer 108 at certain points on the walls of the trench 110 such as at contact points 150a, 150b, 150c and 150d in this example.

In most of the cases, one of the dielectric layers 102 or 106 can be used as the deep trench 110. A deep opening is created by the trench 110 so it causes a discontinuity in the semiconductor (or selected dielectric) layer 130. For example, in top emission displays, one of the dielectric layers acts as a planarization layer which needs to be very thick as shown by the second dielectric layer 106. Thus, this layer is a good candidate for the deep trench structure. To create an even deeper trench, multiple stacked openings in the backplane can be used. For example, FIG. 1 shows a deep trench created in the backplane by using two openings. To create the openings, different patterning techniques such as lithography, liftoff, or molding, shadow masking and/or other techniques can be used.

For depositing the dielectric, conductive and semiconductor layers, different techniques such as plasma enhanced chemical vapor deposition (PECVD), chemical vapor deposition (CVD), sputtering, vapor deposition, printing, spin coating, spray coating, and others can be used.

Figure 2A:
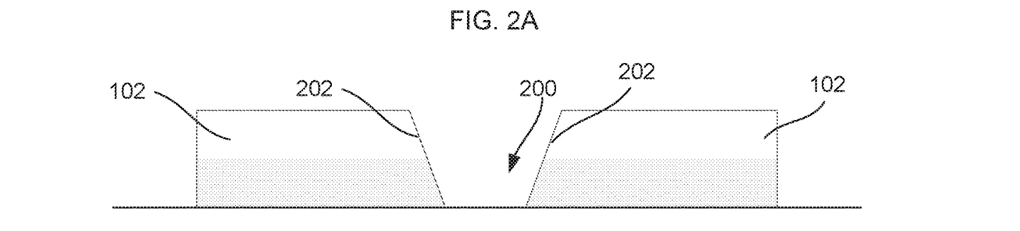
FIGS. 2A-2G are diagrams showing the process of fabricating the device structure in FIG. 1.

One example of developing a deep trench connection in a structure 100 using multiple dielectric layers is shown in FIGS. 2A-2F as described below. FIG. 2A shows the deposition of the dielectric layer 102. In this example, the dielectric layer 102 may be a material such as Silicon-Nitride which is deposited on top of existing structure on the backplane. This may be one of the backplane dielectric layers or an extra layer. An opening 200 in the dielectric layer 102 in the position of the eventual deep-trench 110 in FIG. 1 using photolithography. The opening 200 is driven to depth of the backplane and therefore creates sidewalls 202.

Figure 2B:
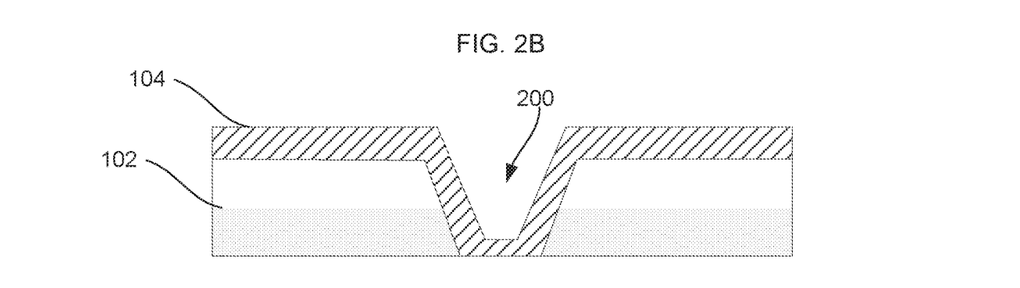

The conductive layer 104 is then deposited over the remaining dielectric layer 102 as shown in FIG. 2B. The conductive layer 104 is deposited over the flat top surfaces of the dielectric layer 102 and the sidewalls 202. The conductive layer 104 may be one of the backplane conductive layers or an extra layer. In this example, the conductive layer 104 is patterned as required by the design (a pattern should be left on top of the opening 200).

Figure 2C:
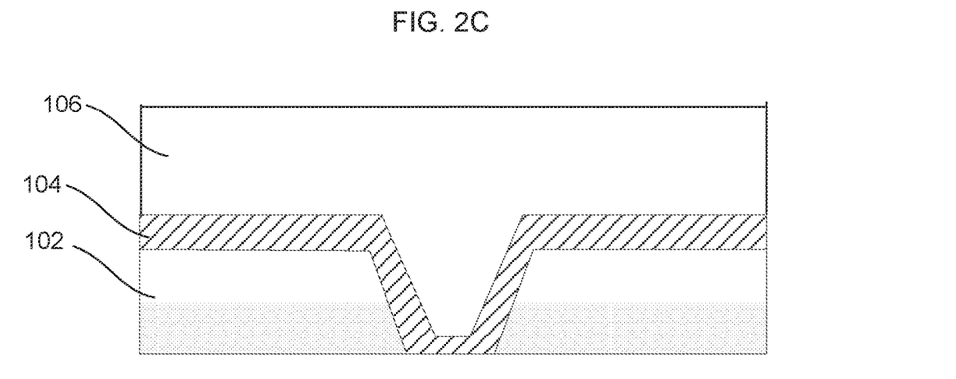

FIG. 2C shows the deposition of the second dielectric layer 106 over the conductive layer 104. The second dielectric layer 106 may be a polymer layer deposited by spin (spray or printing) coating, or it may be a stack of non-organic and polymer layers or non-organic only). This layer can be one of the layers required for the display structure such as planarization layer, or it can be an extra layer added only for the trench development. In this example, the second dielectric layer 106 is relatively thick, thus allowing the creating of the deep trench 110. The second dielectric layer 106 may be patterned using conventional photolithography (molding or other techniques can be used as well). The pattern of the second dielectric layer 106 includes a second opening in the position of the deep trench 110.

Figure 2D:
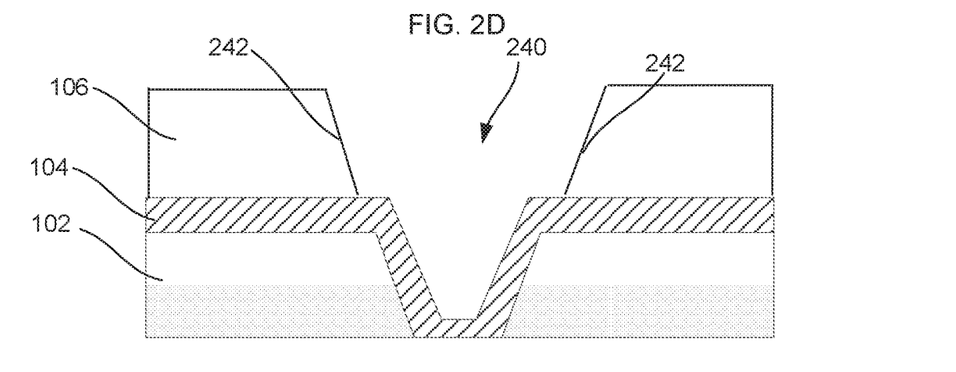

FIG. 2D shows the creation of a second opening 240 which is formed through patterning the second dielectric layer 106. The second opening 240 allows sidewalls 242 to be formed in the second dielectric layer 106. The second opening 240 allows the second dielectric layer 106 to be removed so the conductive layer 104 is exposed. The second opening 240 thus creates trench walls 122 shown in FIG. 1. The combination of the first opening 200 and the second opening 240 create the deep trench 110 and corresponding side walls 120 and 122 in FIG. 1.

Figure 2E:
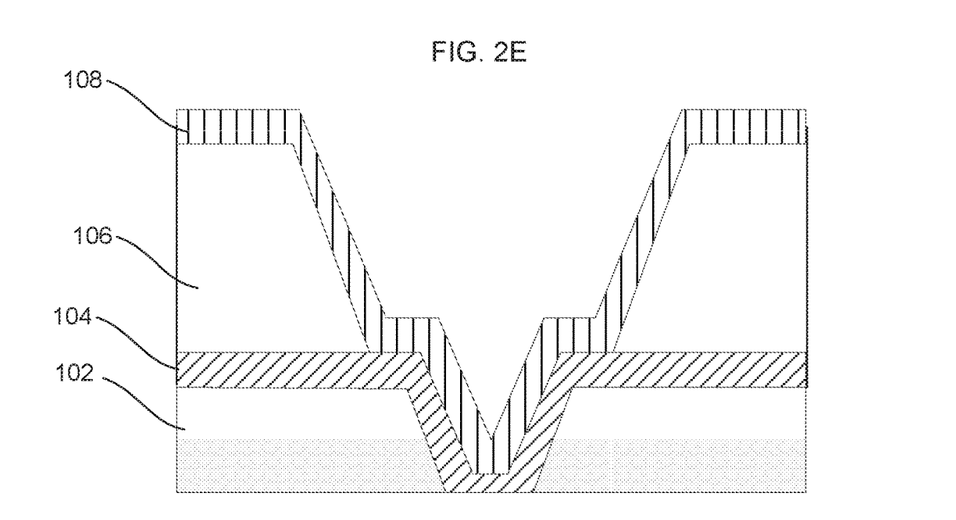

FIG. 2E shows the deposition of the second conductive layer 108 over the trench created in the second dielectric layer 106. The second conductive layer 108 may be one of the display conductive layers such as the OLED anode layer or an extra layer added for the deep trench development. The conductive layer 108 is patterned as required by the design of the device structure. The pattern of the conductive layer 108 includes leaving the conductive layer 108 on the first opening 200.

Figure 2F:
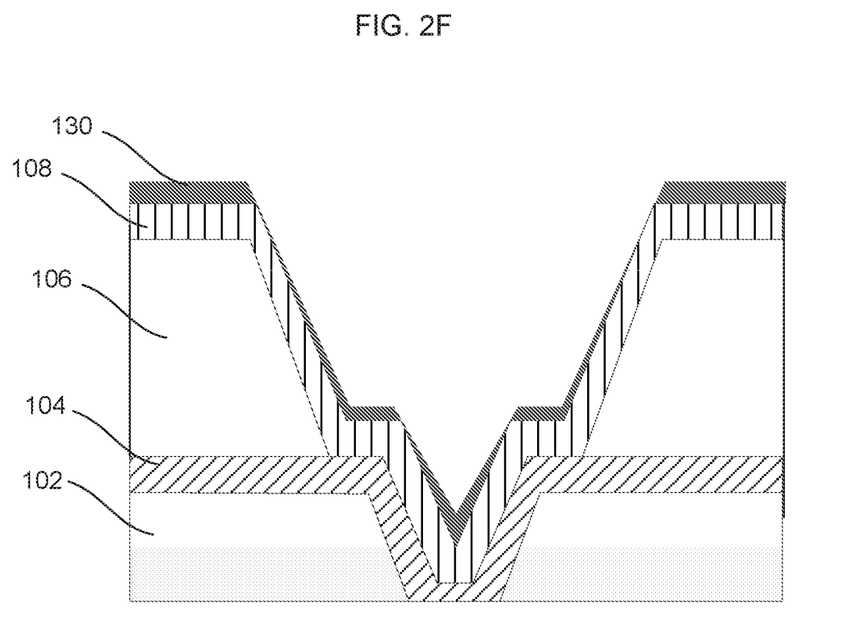

FIG. 2F shows the deposition of the semiconductor layer 130 on the second conductive layer 108. The semiconductor layer 130 may be an OLED structure or other thin film device structure. The semiconductor layer 130 may be deposited with different techniques such as vapor deposition, printing, etc. Since the semiconductor layer 130 is very thin compared to the depth of the trench 110 and the walls 122 of the trench are steep, there will be a discontinuity such as the contact point 150a in the semiconductor layer 130 on the walls 122 and edge of the trench 110.

Figure 2G:
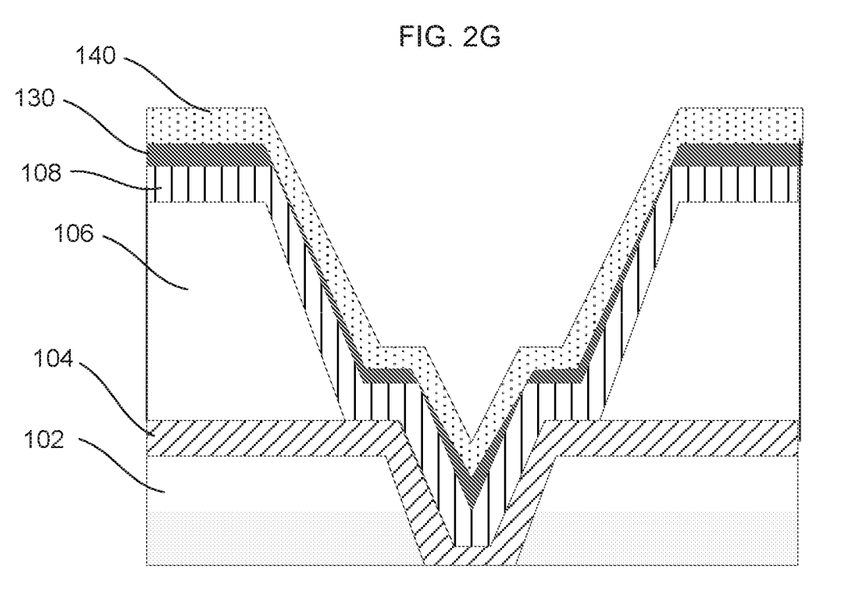

FIG. 2G shows the deposition of the top electrode 140. The top electrode 140 connects to the second conductive layer 108 at the discontinuity areas of the semiconductor layer 130. FIG. 1 shows a number of discontinuity areas 150a, 150b, 150c and 150d which allow contact between the top electrode 140 and the second conductive layer 108.

In the case of a deep trench, the semiconductor (or a dielectric) layer 130 is discontinued at the edges (or walls of the trench). Therefore, after depositing the top electrode 140, the top electrode 140 is connected to the conductive layers 108 at the walls of the trench 110. In this manner, a shadow mask may be avoided to create the contact since the semiconductor layer has discontinuities due to the trench that allows contact.

Figure 3:
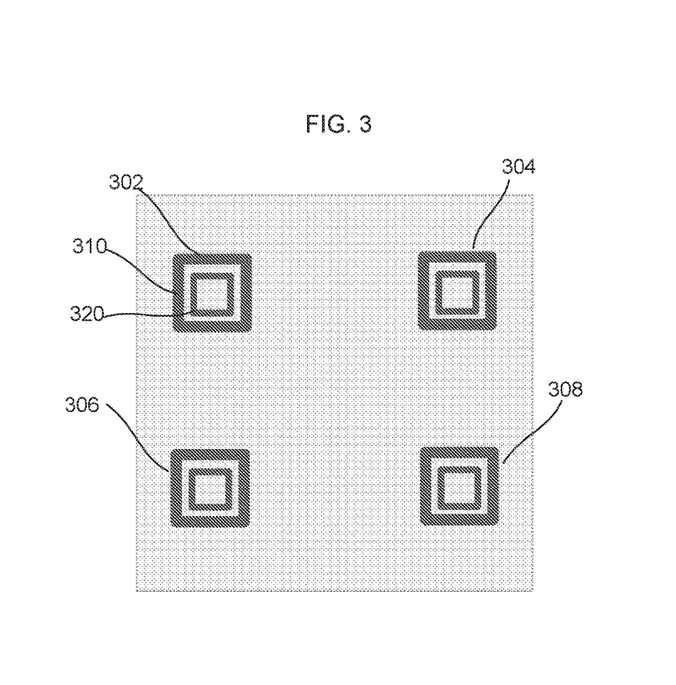
FIG. 3 is a top plan view of the common electrodes in several of the devices having a structure as shown in FIG. 1, showing the contact areas to the conductive layers in each device.

FIG. 3 demonstrates a top view of a device 300 that includes top electrodes 302, 304, 306 and 308. Each of the top electrodes are fabricated in the process described above. The top electrode 302 includes an outer contact area 310 which corresponds to the trench walls in FIG. 1. The outer contact area 310 is at the edge of the trench structure where there is a discontinuity of the semiconductor layer 130 in FIG. 1. An inner contact area 320 also provides contact to the electrode 108 at a discontinuity of the semiconductor layer 130 in FIG. 1. Thus, the top electrodes 302, 304, 306 and 308 are connected to the conductive layers at the discontinuity areas of the semiconductor layers in a trench 110.

When there are thin layers of semiconductor (dielectric) between two conductive layers to form a device, a dielectric layer is used to cover the edge of the bottom conductive layer. For example, an OLED can consist of thin organic layers (with a total thickness of a few 100 nm) which are sandwiched between two conductive layers (at least one of which is transparent). Since the thickness of the bottom conductive layer is significantly more than that of the organic layers, to avoid any short, a dielectric is deposited on the bottom electrode and is patterned in a way that covers the edge of the bottom electrode and leaves the center of the electrode exposed for organic layers.

In some cases, the resistance for one of the conductive layers (electrode) is high, causing a significant voltage drop in the case of an array structure. For example, in the case of a top-emission OLED, the top electrode is transparent and is made of very thin conductive layers.

Figure 4:
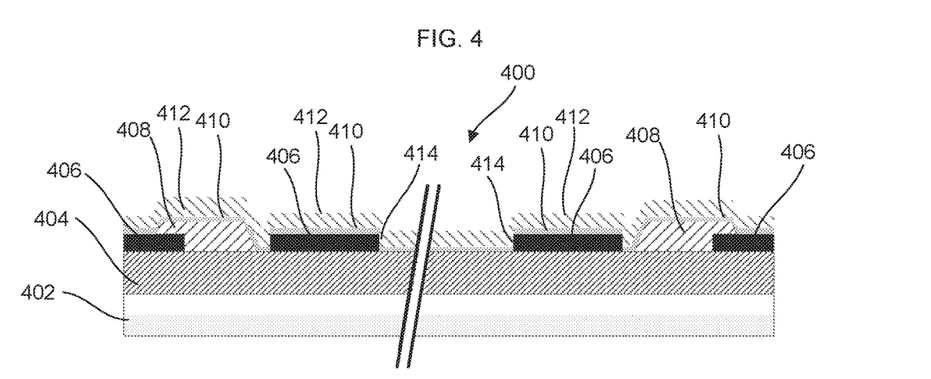
FIG. 4 is a sectional view of a crossing structure for improving the resistance of an electrode.

In order to prevent a significant voltage drop, a lower resistance conductive material may be used before depositing the semiconductor layers. FIG. 4 shows a cross section of a device structure 400 that avoids a significant voltage drop from resistance of one of the conductive layers. In this example, a substrate 402 supports a dielectric layer 404 which serves as a backplane of the device structure 400. The dielectric layer 404 may have numerous other layers that make up the backplane of the device. A series of lower resistance conductive strips 406 is formed on the dielectric layer 404. In this example, the lower resistance conductive strips 406 are patterned such that they have numerous edges. A dielectric layer 408 is formed on some of the conductive strips 406. A thin semiconductor layer 410 which may be an organic material is formed over the horizontal surfaces of the low resistance conductive strips 406 and the dielectric layers 408. As may be seen in FIG. 4, the edges of the lower resistance conductive strips 406 remain exposed and not covered by the semiconductor layer. A top conductive layer 412 is then applied which in this example is transparent but has a high resistance. The top conductive layer 412 is in contact with the lower resistance conductive strips 406 on an edge such as on edges 414 thus shorting out the top conductive layer 412 and lowering the resistance of the contact.

The process of creating the structure in FIG. 4 is based on using lower resistance conductive material for the conductive strips 406 before depositing the semiconductor (dielectric) layers. A low-resistance conductive layer (or stack of conductive layers) is deposited which is thicker than the main semiconductor (dielectric) layers being deposited on top of it. This may be one of the conductive layers existing in the device or a new one added just for this reason. The low resistance conductive layer is then patterned. The pattern should create more edges. For example, stripes such as shown in FIGS. 4 and 5A or a mesh shown in FIG. 5B may create numerous edges.

If there are other layers before the main semiconductor layer, they should be patterned after deposition to leave the edges exposed. For example, in FIG. 4, the dielectric layers 408 are patterned on the low resistance conductive strips 406. The main semiconductor (dielectric) layer 410 is then deposited and patterned as needed by the design. The high-resistance conductive layer 412 is then deposited and patterned as needed. The pattern covers the low-resistance area of the conductive strips 406 and, more importantly, at least one of its edges. The fabrication of device is continued until all the other required layers after this high-resistance conductive layer are deposited and patterned.

The edge or low-resistance conductive material cannot be covered by the main semiconductor (dielectric) since the thickness of the conductive layer is greater than that of the main layer. The high-resistance conductive layer will be shorted to the exposed edge of the low-resistance conductive layer.

Figure 5A:
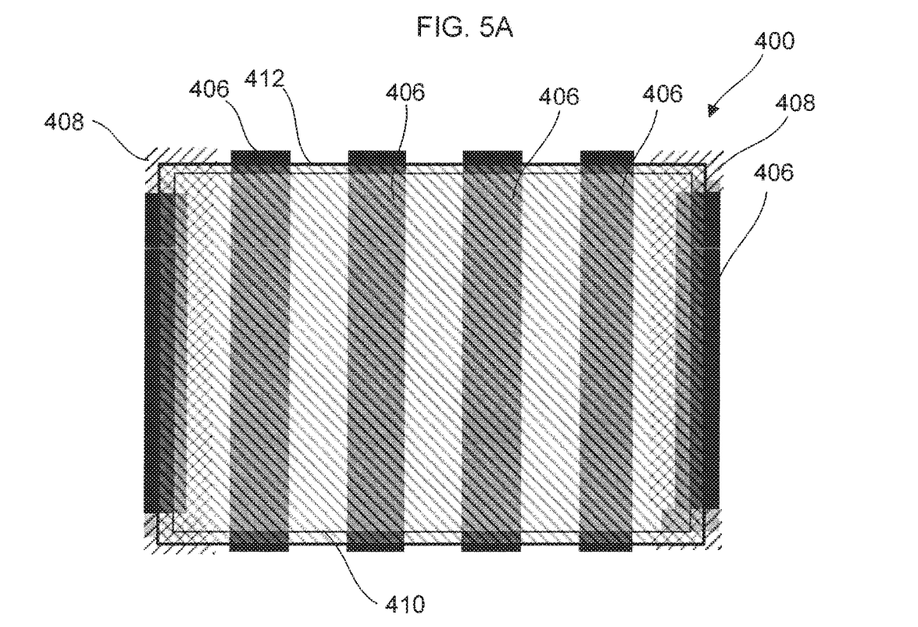
FIG. 5A is a side elevation of a crossing structure for improving the resistance with strip patterning.
Figure 5B:
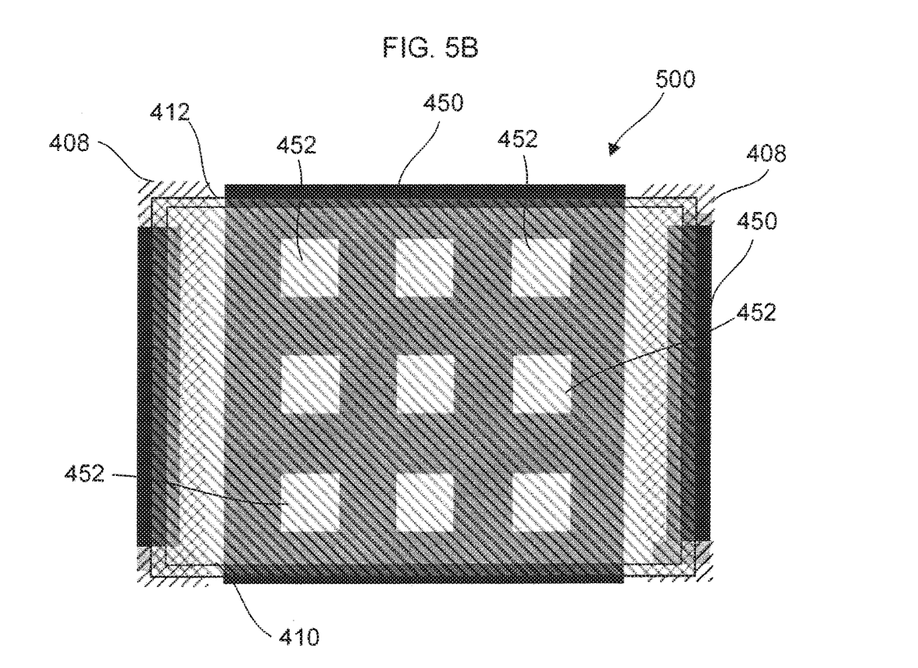
FIG. 5B is a side elevation of another crossing structure for improving the resistance with mesh patterning.

FIGS. 5A and 5B are top plan views of examples of the structure that incorporates the low resistance conductive layers. FIG. 5A shows a top view of the device structure 400 in FIG. 4. The top conductive layer 412 is a transparent layer with high resistance. Since the top conductive layer 412 is deposited over the low resistance conductive strips 406, it contacts the edges of the strips 406 and is shorted to prevent high resistance. The semiconductor layer 410 is fabricated over the conductive strips as well as other layers 408.

FIG. 5B is a top view of another device structure 500 that has the same top conductive layer 412, semiconductor layer 410 and other layers 408 as the structure 400 in FIG. 4. A low resistive conductive layer 450 is patterned in a mesh structure. The low resistive conductive layer 450 has a series of openings 452 that have multiple edges to create contact with the high resistance top conductive layer 412 thus shorting the top conductive layer 412.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A device structure providing contact to conductive layers via a deep trench structure, the device structure comprising:
   a material structure including a top surface and a side wall integral with and joining the top surface;
   a first conductive layer deposited over the material structure on the top surface and the side wall;
   at least one material layer deposited on the first conductive layer, the at least one material layer being continuous on the top surface of the material structure, continuously covering a first portion of the side wall, and having at least one discontinuity on a second portion of the side wall; and
   a second conductive layer deposited on the at least one material layer, the second conductive layer in contact with the first conductive layer on the second portion of the side wall and separated from the first conductive layer by the at least one material layer on the first portion of the side wall,
   the at least one material layer comprised of material different from materials of the first and second conductive layers, the at least one material layer preventing electrical contact between the first and second conductive layers on the first portion of the side wall, and the at least one discontinuity in the at least one material layer for providing electrical contact between the first and second conductive layers on the second portion of the side wall.

2. The device structure of claim 1, wherein the side wall is created by one of lithography, lift off, moulding or shadow masking.

3. The device structure of claim 1, wherein the at least one material layer is part of an organic light emitting diode structure.

4. The device structure of claim 1, wherein the material structure comprises at least one of a silicon-nitride dielectric layer and a polymer dielectric layer.

5. The device structure of claim 1, wherein the material structure comprises at least one layer, and wherein the at least one layer of the material structure, the first conductive layer, and the at least one material layer are deposited via at least one of PECVD, CVD, sputtering, vapor deposition, printing, spin coating, and spray coating.

6. The device structure of claim 1, wherein the first portion of the side wall comprises a lower portion of the side wall and the second portion of the side wall comprises a portion of the side wall between the lower portion of the side wall and the top surface.

7. The device structure of claim 1, wherein the at least one material layer comprises a semiconductor layer.

8. The device structure of claim 1, wherein the at least one material layer comprises a dielectric layer.

9. A method of fabricating a device structure providing contact to conductive layers via a deep trench structure, the method comprising:
   fabricating a material structure including a top surface and a side wall integral with and joining the top surface;
   depositing a first conductive layer over the material structure on the top surface and the side wall;
   depositing at least one material layer on the conductive layer, the at least one material layer being continuous on the top surface of the material structure, continuously covering a first portion of the side wall, and having at least one discontinuity on a second portion of the side wall; and
   depositing a second conductive layer on the at least one material layer, the second conductive layer in contact with the first conductive layer on the second portion of the side wall and separated from the first conductive layer by the at least one material layer on the first portion of the side wall,
   the at least one material layer comprised of material different from materials of the first and second conductive layers, the at least one material layer preventing electrical contact between the first and second conductive layers on the first portion of the side wall, and the at least one discontinuity in the at least one material layer for providing electrical contact between the first and second conductive layers on the second portion of the side wall.

10. The method of claim 9, wherein the side wall is fabricated at least in part by one of lithography, lift off, moulding or shadow masking.

11. The method of claim 9, wherein the at least one material layer is part of an organic light emitting diode structure.

12. The method of claim 9, wherein the material structure comprises at least one of a silicon-nitride dielectric layer and a polymer dielectric layer.

13. The method of claim 9, wherein the material structure comprises at least one layer, and wherein the at least one layer of the material structure is fabricated at least partly via, and the first conductive layer and the at least one material layer are deposited via, at least one of PECVD, CVD, sputtering, vapor deposition, printing, spin coating, and spray coating.

14. The method of claim 9, wherein the first portion of the side wall comprises a lower portion of the side wall and the second portion of the side wall comprises a portion of the side wall between the lower portion of the side wall and the top surface.

15. The method of claim 9, wherein the at least one material layer comprises a semiconductor layer.

16. The method of claim 9, wherein the at least one material layer comprises a dielectric layer.

* * * * *